US008962385B2

(12) United States Patent
Hong et al.

(10) Patent No.: US 8,962,385 B2
(45) Date of Patent: Feb. 24, 2015

(54) RERAM DEVICE STRUCTURE

(71) Applicant: Freescale Semiconductor, Inc., Austin, TX (US)

(72) Inventors: Cheong M. Hong, Austin, TX (US); Ko-Min Chang, Austin, TX (US); Feng Zhou, Fremont, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/490,062

(22) Filed: Sep. 18, 2014

(65) Prior Publication Data

US 2015/0004747 A1 Jan. 1, 2015

Related U.S. Application Data

(62) Division of application No. 13/442,046, filed on Apr. 9, 2012, now Pat. No. 8,860,001.

(51) Int. Cl.
*H01L 21/06* (2006.01)
*H01L 45/00* (2006.01)

(52) U.S. Cl.
CPC .................... *H01L 45/1633* (2013.01)
USPC ............... 438/102; 257/2; 257/4; 365/148

(58) Field of Classification Search
CPC .... H01L 45/145; H01L 45/146; H01L 45/147
USPC ........................... 365/148; 257/2–5
See application file for complete search history.

(56) References Cited

U.S. PATENT DOCUMENTS

| 6,249,014 | B1 | 6/2001 | Bailey |
| 8,093,698 | B2 * | 1/2012 | Rathor et al. ............ 257/682 |
| 8,227,782 | B2 * | 7/2012 | Noshiro ................. 257/2 |
| 2006/0019493 | A1 | 1/2006 | Li |
| 2008/0185573 | A1 * | 8/2008 | Sun et al. ............... 257/4 |
| 2008/0266940 | A1 | 10/2008 | Lai et al. |
| 2009/0230556 | A1 | 9/2009 | Mikawa et al. |
| 2010/0083487 | A1 | 4/2010 | Noshiro et al. |
| 2011/0317471 | A1 | 12/2011 | Chien et al. |
| 2012/0261635 | A1 | 10/2012 | Zhou et al. |

FOREIGN PATENT DOCUMENTS

| EP | 2099070 A1 | 9/2009 |
| EP | 2202816 A1 | 6/2010 |

OTHER PUBLICATIONS

Jousseaume, V. et al., "Back-End-of-Line integration approaches for resistive memories", CEA France, STMicroelectronics, IEEE, Interconnect Technology Conference, 2009, IITC 2009.

Meyer, R. et al., "Oxide Dual-Layer Memory Element for Scalable Non-Volatile Cross-Point Memory Technology", UNITY Semiconductor Corporate, IEEE, 9th Annual Non-Volatile Memory Technology Symposium, NVMTS, 2008.

* cited by examiner

*Primary Examiner* — Matthew W Such
*Assistant Examiner* — Ali Naraghi

(57) ABSTRACT

A resistive random access memory (ReRAM) includes a first metal layer having a first metal and a metal-oxide layer on the first metal layer. The metal-oxide layer includes the first metal. The ReRAM further includes a second metal layer over the metal-oxide layer and a first continuous conductive barrier layer in physical contact with sidewalls of the first metal layer and of the metal-oxide layer.

9 Claims, 5 Drawing Sheets

US 8,962,385 B2

RERAM DEVICE STRUCTURE

This application is a divisional application of a U.S. patent application entitled "ReRam Device Structure", having a Ser. No. 13/442,046, having a filing date of Apr. 9, 2012, having common inventors, and having a common assignee, all of which is incorporated by reference in its entirety.

BACKGROUND

1. Field

This disclosure relates generally to non-volatile memories (NVMs), and more specifically, to resistive random access memories (ReRAMs).

2. Related Art

The development of resistive random access memories is promising because many of the shortcomings related to floating gate non-volatile memories (NVMs) are overcome. ReRAM cells have a dielectric that can, using electrical means, be made to have conductive filaments that establish a low resistance. The process can be reversed whereby filaments are broken raising the resistance to a higher resistance. One of the issues though is the inconsistent formation of filaments near the sidewalls of a the storage medium. When they do form, the low resistance is lower than when they don't form. Similarly, when they form, the higher resistance is also lower. Thus, the center point between the higher resistance and the low resistance is variable based on the degree to which filaments are formed on the sidewalls of the storage medium. This makes sensing more difficult. This same type of difficulty that can arise due to vacancies, especially involving oxygen, that can transfer between the storage medium and the surrounding dielectric. The amount of the vacancies and the extent of movement can vary greatly, further increasing the variation in resistance for the low resistance and the high resistance. A further potential contributor to resistance variation is metal out diffusing from the metal oxide that is used as the storage medium. Outdiffusion can vary which will be another cause of resistance variation of the storage medium. Also, always a consideration is the ease with which any solution can be implemented. Since it is a different type of technology than normal semiconductor technology, the use of established techniques can be difficult in achieving a desired result for ReRAMs.

Accordingly there is a need for an ReRAM and a method of making the ReRAM that improves upon one or more of the issues described above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a resistive random access memory (ReRAM) is made using a barrier metal nitride on the sidewalls of the lower electrode and the storage medium. This has the effect of reducing the number of unwanted filaments along the sidewall of the storage medium. The top electrode also has a barrier on its sidewalls. The barrier for the top electrode is not in contact with the barrier for the bottom electrode and the storage medium. Tantalum nitride is considered particularly beneficial because it is also an effective barrier to copper and oxygen vacancy migration. Also, the process steps, individually, are established techniques so the ease of implementation is high. This is better understood by reference to the following specification and the FIGs.

Figure 1:
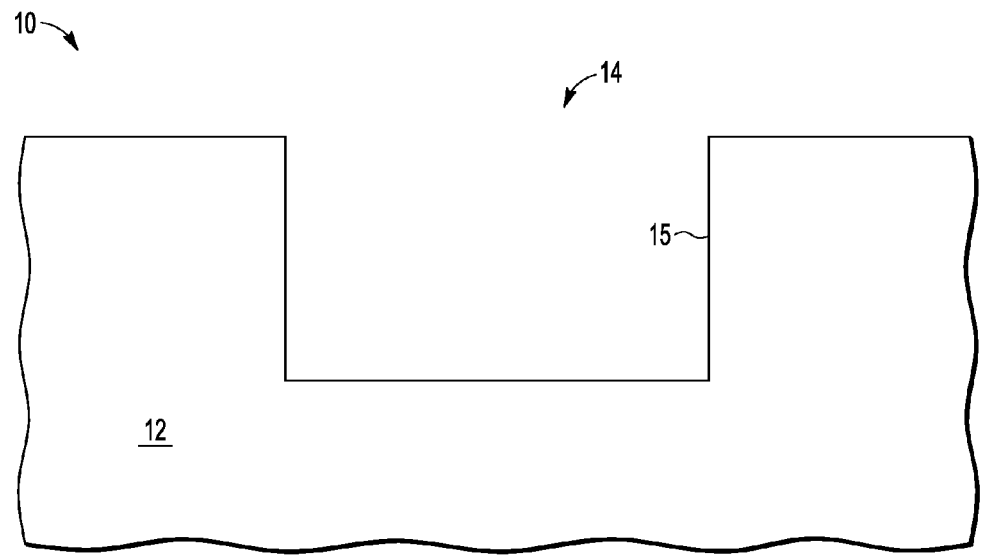
FIG. 1 is a cross section of an ReRAM device structure at a stage in processing.

Shown in FIG. 1 is a device structure 10 having a dielectric layer 12 with opening 14. Dielectric layer 12 may be of the same type as is used for interlayer dielectrics (ILDs). Opening 14 is for forming an ReRAM cell and may have a depth and width of 100 nanometers and 50 nanometers, respectively. In an a likely application, dielectric layer 12 would be over a semiconductor substrate and would be part of an interconnect layer of a semiconductor die. Opening 14 has a sidewall 15.

Figure 2:
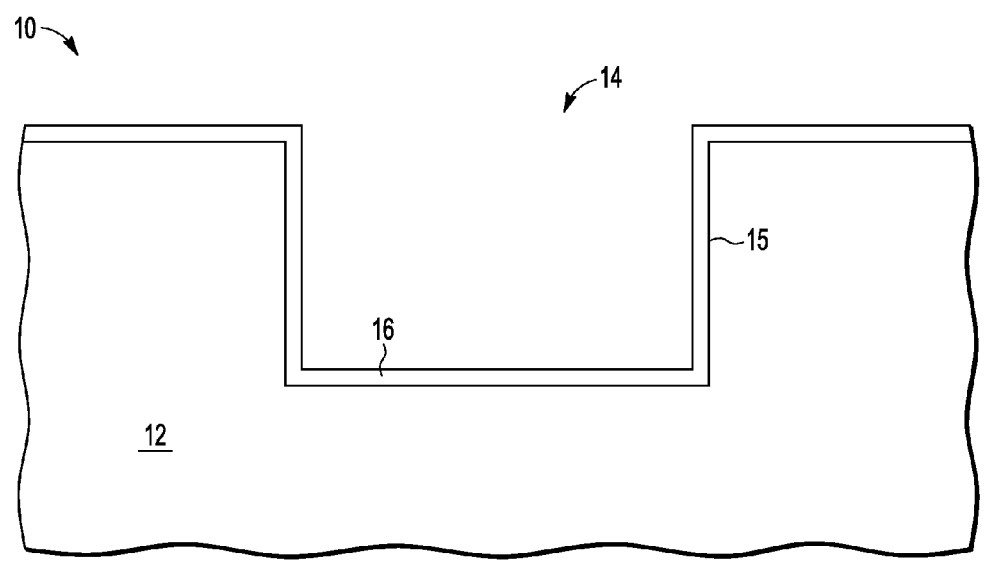
FIG. 2 is a cross section of the ReRAM of FIG. 1 at a subsequent stage in processing.

Shown in FIG. 2 is device structure 10 after depositing a conductive layer 16 on dielectric layer 12 including in opening 14. Conductive layer 16 may be tantalum nitride (TaN) which can be deposited by a conventional technique relatively conformally. TaN is considered particularly effective in this situation because of it being an effective barrier to copper migration. Other conductive materials, especially metallic nitrides, may also be found to be effective. Nitrides tend to work as an effective diffusion barrier to copper diffusion. Conductive layer 16 may have a thickness of about 10 nanometers.

Figure 3:
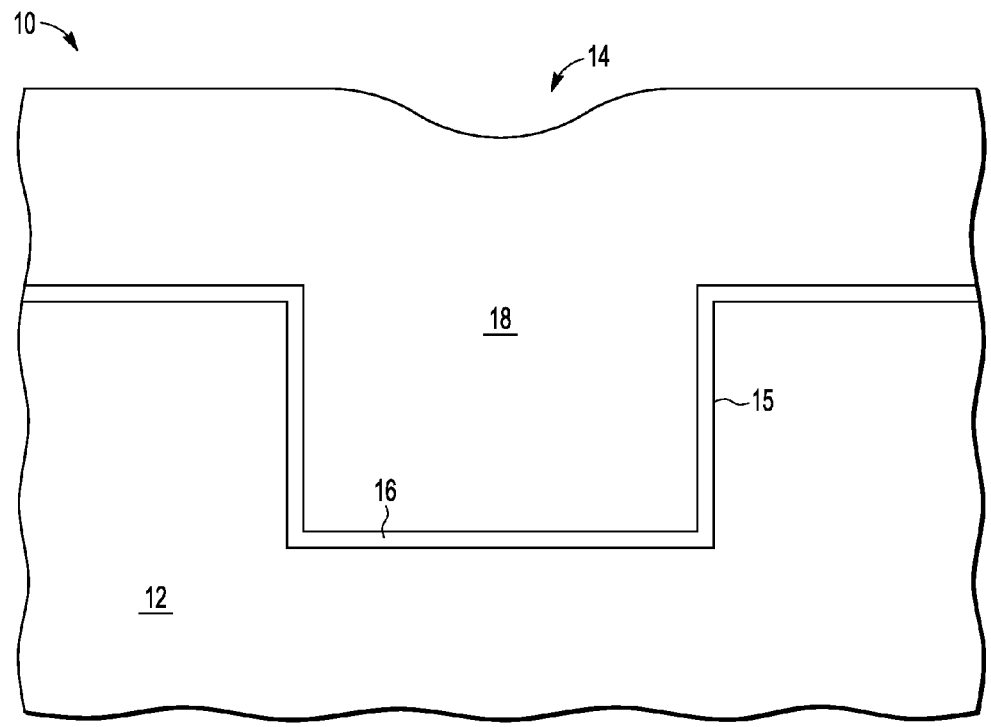
FIG. 3 is a cross section of the ReRAM of FIG. 2 at a subsequent stage in processing.

Shown in FIG. 3 is device structure 10 after depositing a conductive layer 18 over conductive layer 16 and fills opening 14. Conductive layer 18 may be copper which is commonly used in semiconductor manufacturing for interconnect by filling openings. Conductive layer 18 may be about the same thickness as the depth of opening 14 below the top surface of dielectric layer 12 after depositing conductive layer 18.

Figure 4:
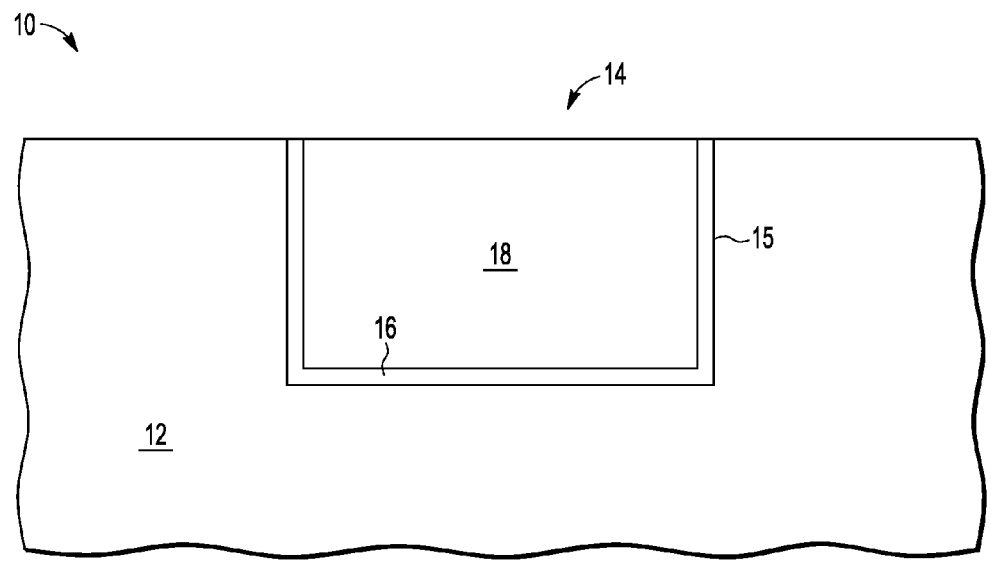
FIG. 4 is a cross section of the ReRAM of FIG. 3 at a subsequent stage in processing.

Shown in FIG. 4 is device structure 10 after performing a planarizing step such as chemical mechanical polishing (CMP) which results in the conductive layers 16 and 18 being removed from the top surface of dielectric layer 12. Conductive layers 16 and 18 have exposed surfaces which are substantially planar with the top surface of dielectric layer 12. With the top surface of dielectric layer 12 receiving the planarizing, the depth of opening 14 will be reduced some. This amount can be very small or can be increased by continuing the planarizing longer than needed to simply remove conductive layers 18 and 16 from the top surface of dielectric layer 12.

Figure 5:
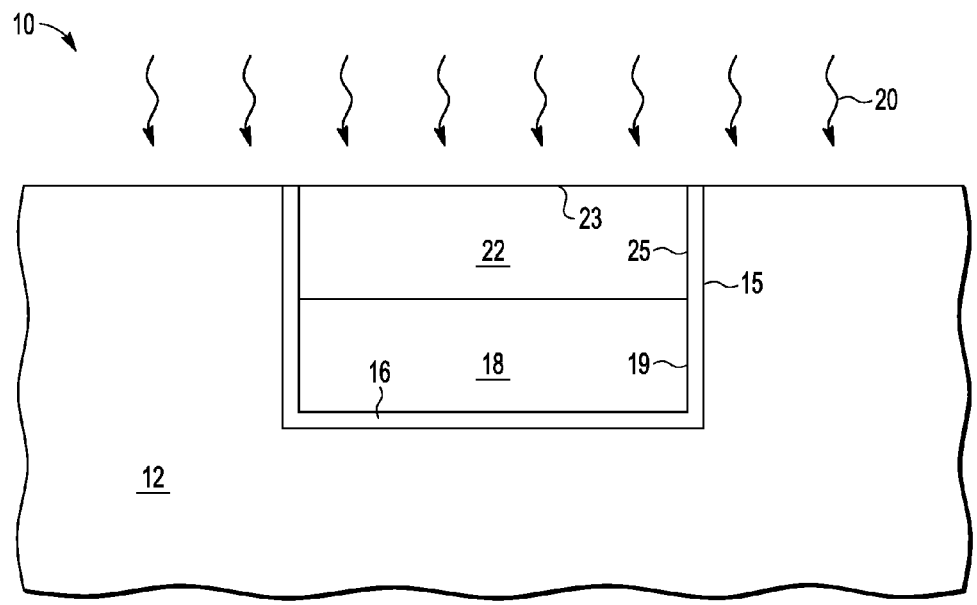
FIG. 5 is a cross section of the ReRAM of FIG. 4 at a subsequent stage in processing.

Shown in FIG. 5 is device structure 10 after performing an oxidation step 20 to form an oxidation layer 22 from the top portion of conductive layer 18 remaining on sidewall 15 after the planarizing step. Oxidation layer 22 is copper oxide for the case where conductive layer 18 is copper. Oxidation step 20 may be an application of oxygen as $O_2$. Other techniques for forming an oxide of conductive layer 18 may also be used.

Thermal budget may not to be taken into account when considering the speed with which oxidation layer 22 is formed and also the thickness of oxidation layer 22. The speed of oxide formation is relative to the temperature at which the process is formed. Thus, the optimization of the thickness of oxidation layer 22, the speed of deposition, and the effect on underlying already formed circuitry may need to be balanced. Oxidation layer 22, which is where filaments are formed and broken, may also be referenced as storage medium 22 or metal-oxide layer 22. Storage medium 22 has a top surface 23 which is exposed. Exposed top surface 23 has a perimeter bounded by conductive layer 16. Top surface 23 may be considered a major surface. Conductive layer 16, being along sidewall 15 is in contact with sidewall 25 of storage medium 22 and sidewall 19 of conductive layer 18.

Figure 6:
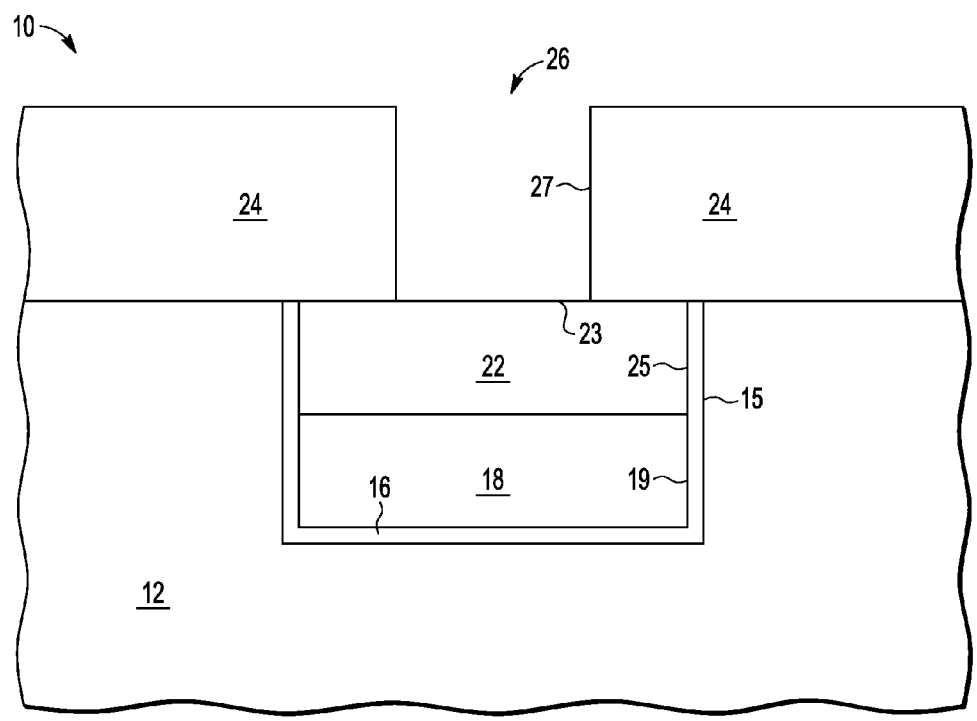
FIG. 6 is a cross section of the ReRAM of FIG. 5 at a subsequent stage in processing.

Shown in FIG. 6 is device structure 10 after forming a dielectric layer 24 having an opening 26 over a portion of the top surface of storage medium 22. Opening 26 has a sidewall 27. Dielectric layer 24 may be formed in the manner of forming dielectric layer 12 and thus formed as an ILD. The opening is within the perimeter of storage medium 22 so that opening 26 is spaced away from the top portion of conductive layer 16. Opening 26 may have a depth of about 80 percent of the depth of opening 14 of FIG. 1.

Figure 7:
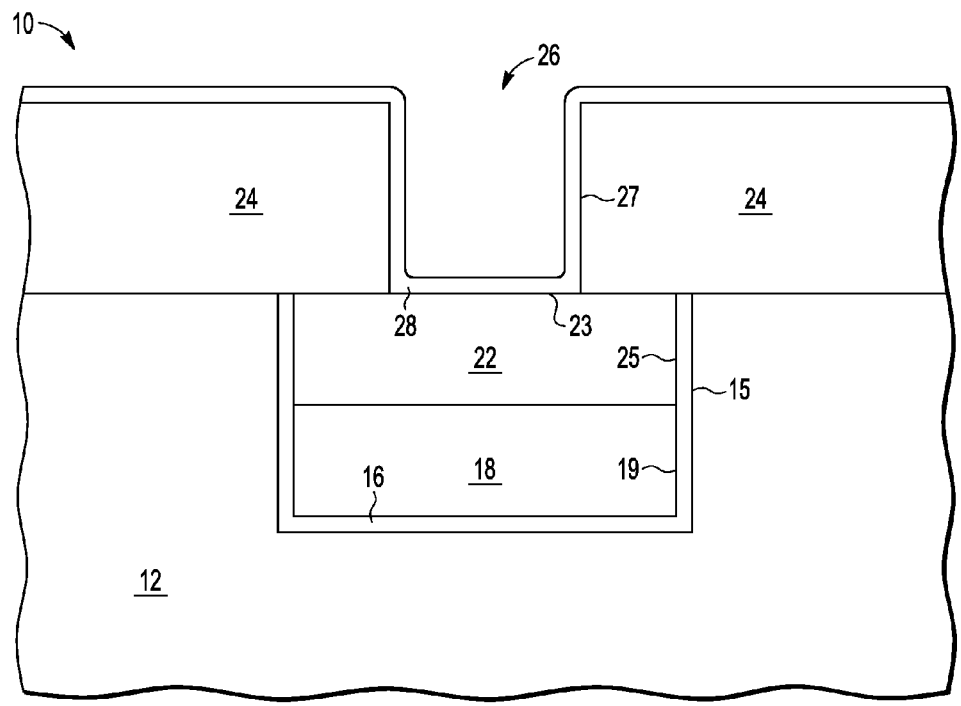
FIG. 7 is a cross section of the ReRAM of FIG. 6 at a subsequent stage in processing.

Shown in FIG. 7 is device structure 10 after forming a conductive layer 28 that may be the same thickness and material as conductive layer 16. Thus conductive layer 28 may be TaN and about 10 nanometers thick and is over dielectric layer 24 including in opening 26 and along sidewall 27 and over top surface 23.

Figure 8:
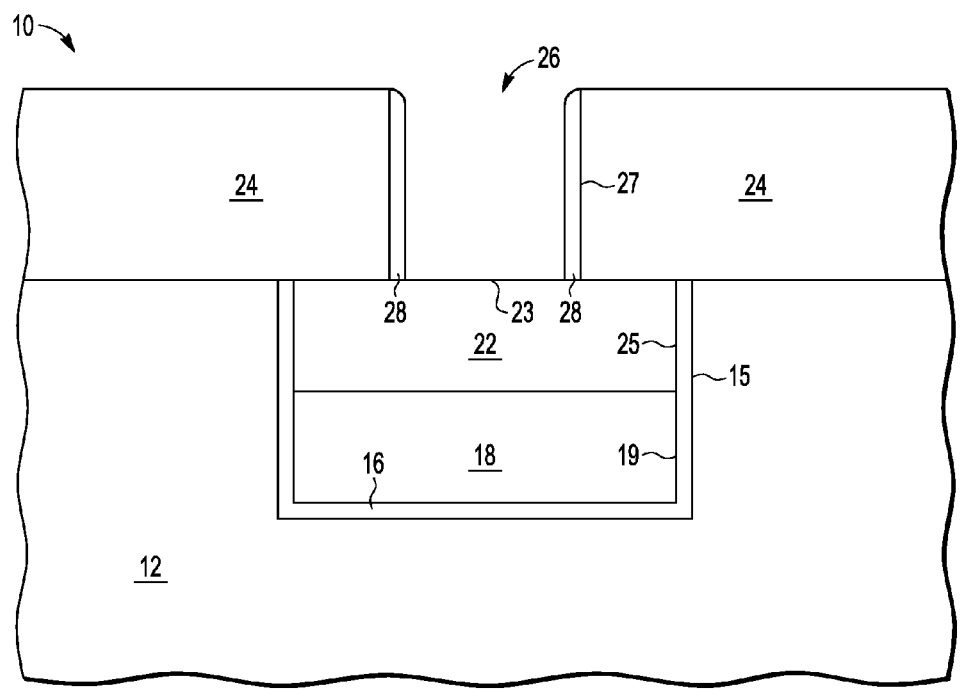
FIG. 8 is a cross section of the ReRAM of FIG. 7 at a subsequent stage in processing.

Shown in FIG. 8 is device structure 10 after performing an anisotropic etch to remove conductive layer 28 at an interface between conductive layer 28 and storage medium 22. This also removes conductive layer 28 from the top surface of dielectric layer 24. This etch also erodes a portion of conductive layer 28 at a top corner of dielectric layer 24, but conductive layer 28 otherwise is retained along sidewall 27 of opening 26.

Figure 9:
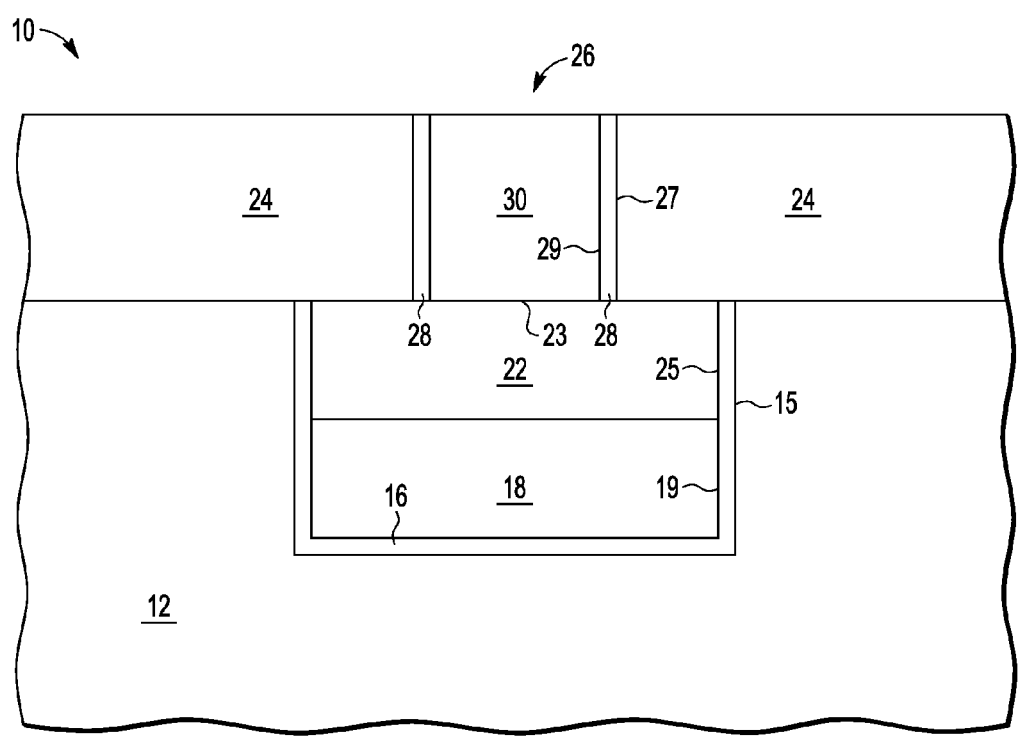
FIG. 9 is a cross section of the ReRAM of FIG. 8 at a subsequent stage in processing.

Shown in FIG. 9 is device structure 10 after depositing a conductive layer 30 and performing a planarizing step showing a completed ReRAM cell in which conductive layer 30 has a sidewall in opening 26 that is in physical contact with conductive layer 28. This combination deposition and planarization is similar to the process described and shown in FIGS. 3 and 4. In this case shown in FIG. 9, the planarizing step may need to be extended to ensure that the degradation at the top corner of dielectric layer 24 lowers the top surface of dielectric layer 24 enough to ensure that the degradation at the top corner of dielectric layer 24 is removed. The remaining portion of conductive layer 30 may be considered a top electrode 30 of the ReRAM cell. Similarly, conductive layer 18 shown in FIG. 9 may be considered a bottom electrode 18 of the ReRAM cell. For the ReRAM shown in FIG. 9 both conductive layers 16 and 28 are continuous. Conductive layer 16 extends along the bottom of opening 14, but the portion along sidewall 15 is also continuous. Although conductive layer 28 has been removed from the bottom of opening 26, conductive layer 28 is along the entire sidewall 27 of opening 26 so it is also continuous. Conductive layers 16 and 28 are disconnected from each other though. Also conductive layer 16 does not contact top electrode 30.

Thus, it is shown, that an effective barrier to copper diffusion can also be used to reduce filament formation at the border of the storage medium as well as a barrier to oxygen diffusion between the storage medium and the surrounding dielectric. The diffusion barrier for the storage medium can be metal, which is a conductor, because the diffusion barrier for the storage medium does not contact the top electrode. The diffusion barrier for both the top electrode and the storage medium is particularly effectively achieved with a metallic nitride. Further it may be especially beneficially achieved with tantalum nitride.

By now it should be appreciated that there has been provided a resistive random access memory (ReRAM) that includes a first metal layer comprising a first metal. The ReRAM further includes a metal-oxide layer on the first metal layer, wherein the metal-oxide layer comprises the first metal. The ReRAM further includes a second metal layer over the metal-oxide layer. The ReRAM further includes a first continuous conductive barrier layer in physical contact with sidewalls of the first metal layer and sidewalls of the metal-oxide layer. The ReRAM may further include a second continuous conductive barrier layer in physical contact with sidewalls of the second metal layer and electrically isolated from the first continuous conductive barrier layer. The ReRAM may have a further characterization by which the second continuous conductive barrier layer extends between the second metal layer and the metal-oxide layer. The ReRAM may further include a first dielectric layer surrounding the sidewalls of the first metal layer and the sidewalls of the metal-oxide layer, wherein the first continuous conductive barrier layer is between the first dielectric layer and the sidewalls of the first metal layer and the metal-oxide layer and a second dielectric layer surrounding the sidewalls of the second metal layer, wherein the second continuous conductive barrier layer is between the second dielectric layer and the sidewalls of the second metal layer. The ReRAM may have a further characterization by which the second metal layer is located within a perimeter of a first major surface of the metal-oxide layer. The ReRAM may have a further characterization by which the first continuous conductive barrier layer extends under the first metal layer. The ReRAM may have a further characterization by which the first metal layer comprises copper, and the metal-oxide layer comprises copper oxide. The ReRAM may have a further characterization by which the first continuous conductive barrier layer comprises nitride. The ReRAM may have a further characterization by which the metal-oxide layer is further characterized as a storage medium.

Also disclosed is a resistive random access memory (ReRAM) having a first metal layer comprising a first metal. The ReRAM further includes a metal-oxide layer on the first metal layer, wherein the metal-oxide layer comprises the first metal. The ReRAM further includes a second metal layer over the metal-oxide layer and within a perimeter of a first major surface of the metal-oxide layer. The ReRAM further includes a first continuous conductive barrier layer in physical contact with sidewalls of the first metal layer and of the metal-oxide layer. The ReRAM further includes a second continuous conductive barrier layer in physical contact with sidewalls of the second metal layer and in physical contact with the first major surface of the metal-oxide layer, wherein the second continuous conductive barrier layer is within the perimeter of the first major surface of the metal-oxide layer and is physically separate from the first continuous conductive barrier layer. The ReRAM may have a further characterization by which the first continuous conductive barrier layer extends under the first metal layer Disclosed also is a method of forming a resistive random access memory (ReRAM) that includes forming a first opening in a first dielectric layer. The method further includes forming a continuous barrier layer within the first opening, wherein the continuous barrier layer is in physical contact with a sidewall of the first opening and a bottom of the first opening. The method further includes forming a first metal layer within the first opening. The method further includes oxidizing a top portion of the first metal layer to form a metal-oxide layer within the first opening, wherein the continuous barrier layer within the first opening is in physical contact with sidewalls of the metal-oxide layer and the first metal layer. The method further includes forming a second metal layer over the metal-oxide layer, wherein the second metal layer is located within a perimeter of a major surface of the metal-oxide layer. The method may have a further characterization by which the step of forming the second metal layer over the metal-oxide layer includes forming a second dielectric layer over the first dielectric layer, forming a second opening in the second dielectric layer which exposes the metal-oxide layer and does not expose the first dielectric layer, forming a second continuous barrier layer in physical contact with a sidewall of the second opening, and forming the second metal layer within the second opening and in physical contact with the second continuous barrier layer. The method may have a further characterization by which the step of forming the second continuous barrier layer in physical contact with the sidewall of the second opening is performed such that the second continuous barrier layer is also formed along a bottom of the second opening in physical contact with the exposed metal-oxide layer, wherein the step of forming the second metal layer within the opening is performed such that the second continuous barrier layer is between the second metal layer and the major surface of the metal-oxide layer. The method may have a further characterization by which the step of forming the second metal layer within the second opening is performed such that the second metal layer is in physical contact with the exposed metal-oxide layer. The method may have a further characterization by which each of the first and the second continuous barrier layers are conductive. The method may have a further characterization by which each of the first and second continuous barrier layers comprise nitride. The method may have a further characterization by which the first and second metal layers comprise copper, and the metal-oxide layer comprises copper oxide. The method may have a further characterization by which wherein the first continuous barrier layer is conductive. The method may have a further characterization by which the first continuous barrier layer comprises a nitride.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, some layers may be a stack of layers. For example, dielectric layers 12 and 24 may be made up of several different dielectric layers. Also additional layers may be present, such as an additional diffusion barrier, between conductive layer 16 and sidewall 15. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a resistive random access memory (ReRAM) comprising:
    forming a first opening in a first dielectric layer;
    forming a continuous barrier layer within the first opening, wherein the continuous barrier layer is in physical contact with a sidewall of the first opening and a bottom of the first opening;
    forming a first metal layer within the first opening;
    oxidizing a top portion of the first metal layer to form a metal-oxide layer within the first opening, wherein the continuous barrier layer within the first opening is in physical contact with sidewalls of the metal-oxide layer and the first metal layer; and
    forming a second metal layer over the metal-oxide layer, wherein the second metal layer is located within a perimeter of a major surface of the metal-oxide layer.

2. The method of claim 1, wherein the step of forming the second metal layer over the metal-oxide layer comprises:
    forming a second dielectric layer over the first dielectric layer;
    forming a second opening in the second dielectric layer which exposes the metal-oxide layer and does not expose the first dielectric layer;
    forming a second continuous barrier layer in physical contact with a sidewall of the second opening; and
    forming the second metal layer within the second opening and in physical contact with the second continuous barrier layer.

3. The method of claim 2, wherein the step of forming the second continuous barrier layer in physical contact with the sidewall of the second opening is performed such that the second continuous barrier layer is also formed along a bottom of the second opening in physical contact with the exposed metal-oxide layer, wherein the step of forming the second metal layer within the opening is performed such that the second continuous barrier layer is between the second metal layer and the major surface of the metal-oxide layer.

4. The method of claim 2, wherein the step of forming the second metal layer within the second opening is performed such that the second metal layer is in physical contact with the exposed metal-oxide layer.

5. The method of claim 2, wherein each of the first and the second continuous barrier layers are conductive.

6. The method of claim 5, wherein each of the first and second continuous barrier layers comprise nitride.

7. The method of claim 1, wherein the first and second metal layers comprise copper, and the metal-oxide layer comprises copper oxide.

8. The method of claim 7, wherein the first continuous barrier layer is conductive.

9. The method of claim 8, wherein the first continuous barrier layer comprises a nitride.

* * * * *